(12) United States Patent
Freese et al.

(10) Patent No.: US 10,809,183 B2
(45) Date of Patent: Oct. 20, 2020

(54) THERMAL DRIFT COMPENSATION IN OPTICAL COMPUTING DEVICES

(71) Applicant: Halliburton Energy Services, Inc., Houston, TX (US)

(72) Inventors: Robert Freese, Pittsboro, NC (US); David L. Perkins, Easton, PA (US); William J. Soltmann, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/753,387

(22) PCT Filed: Jun. 8, 2017

(86) PCT No.: PCT/US2017/036534
§ 371 (c)(1),
(2) Date: Feb. 19, 2018

(87) PCT Pub. No.: WO2018/226231
PCT Pub. Date: Dec. 13, 2018

(65) Prior Publication Data
US 2020/0217783 A1 Jul. 9, 2020

(51) Int. Cl.
| | | |
|---|---|---|
| *G01N 21/27* | (2006.01) | |
| *G01N 21/552* | (2014.01) | |
| *G01N 21/64* | (2006.01) | |
| *G01N 21/65* | (2006.01) | |
| *H03F 1/30* | (2006.01) | |

(52) U.S. Cl.
CPC ......... *G01N 21/274* (2013.01); *G01N 21/552* (2013.01); *G01N 21/64* (2013.01); *G01N 21/65* (2013.01); *H03F 1/30* (2013.01)

(58) Field of Classification Search
CPC ...... G01N 21/274; G01N 21/65; G01N 21/64; G01N 21/552; H03F 1/30
See application file for complete search history.

(56) References Cited

U.S. PATENT DOCUMENTS

| | | |
|---|---|---|
| 5,408,697 A | 4/1995 | Price et al. |
| 5,542,285 A | 8/1996 | Merilainen et al. |
| 2011/0210271 A1 | 9/2011 | Leboeuf et al. |
| 2016/0336905 A1 | 11/2016 | Giacomini |
| 2017/0059474 A1* | 3/2017 | Cohen ................... H01S 3/0071 |

FOREIGN PATENT DOCUMENTS

| | | | |
|---|---|---|---|
| EP | 0336206 | A2 | 10/1989 |
| WO | WO 2001/084118 | A2 | 11/2001 |

OTHER PUBLICATIONS

Haibach, "Precision in Multivariate Optical Computing," *Applied Optics*, Apr. 1, 2004, vol. 43, No. 10, pp. 2130-2140.
(Continued)

*Primary Examiner* — Hina F Ayub
(74) *Attorney, Agent, or Firm* — Haynes and Boone, LLP

(57) ABSTRACT

An optical computing device adapted to compensate for the effects of detector thermal drift. A thermal drift compensation circuit is provided to drive up the optical detector gain as the temperature increases.

15 Claims, 4 Drawing Sheets

(56) References Cited

OTHER PUBLICATIONS

International Search Report and the Written Opinion of the International Search Authority, or the Declaration, dated Dec. 27, 2017, PCT/US2017/036534, 13 pages, ISA/KR.
Myrick, et al. "A Single-Element All-Optical Approach to Chemometric Prediction," *Vibrational Spectroscopy*, 2002, vol. 28, No. 1, pp. 73-81.
Nelson, et al., "Multivariate Optical Computation for Predictive Spectroscopy," *Analytical Chemistry*, Jan. 1, 1998, vol. 70, No. 1, pp. 73-82.
Priore, et al., "A Miniature Stereo Spectral Imaging System for Multivariate Optical Computing," *Applied Spectroscopy*, Mar. 22, 2004, vol. 58, No. 7, pp. 870-873.
Profeta, et al., "Spectral Resolution in Multivariate Optical Computing," *Spectrochimica Acta Part A: Molecular and Biomolecular Spectroscopy*, 2007, vol. 67, No. 2, pp. 483-502.
Simcock, et al. "Precision in Imaging Multivariate Optical Computing," *Applied Optics*, Mar. 1, 2007, vol. 46, No. 7, pp. 1066-1080.
Soyemi, et al. "Design and Testing of a Multivariate Optical Element: The First Demonstration of Multivariate Optical Computing for Predictive Spectroscopy," *Analytical Chemistry*, Mar. 15, 2001, vol. 73, No. 6, pp. 1069-1079.
Soyemi, et al., "Design of Angle-Tolerant Multivariate Optical Elements for Chemical Imaging," *Applied Optics*, Apr. 1, 2002, vol. 41, No. 10, pp. 1936-1941.

\* cited by examiner

THERMAL DRIFT COMPENSATION IN OPTICAL COMPUTING DEVICES

PRIORITY

The present application is a U.S. National Stage patent application of International Patent Application No. PCT/US2017/036534, filed on Jun. 8, 2017, the benefit of which is claimed and the disclosure of which is incorporated herein by reference in its entirety.

FIELD OF THE DISCLOSURE

The present disclosure relates generally to optical systems and, more specifically, to an optical computing device adapted to compensate for the effects of thermal drift.

BACKGROUND

In recent years, optical computing techniques have been developed for applications in the oil and gas industry in the form of optical sensors on downhole or surface equipment to evaluate a variety of fluid properties. In general, an optical computing device is a device configured to receive an input of electromagnetic radiation from a sample and produce an output of electromagnetic radiation from a processing element, also referred to as an optical element, wherein the output reflects the measured intensity of the electromagnetic radiation. The optical computing device may be, for example, an Integrated Computational Element ("ICE"). One type of an ICE is an optical thin film optical interference device, also known as a multivariate optical element ("MOE").

Fundamentally, optical computing devices utilize optical elements to perform calculations, as opposed to the hardwired circuits of conventional electronic processors. When light from a light source interacts with a substance, unique physical and chemical information about the substance is encoded in the electromagnetic radiation that is reflected from, transmitted through, or radiated from the sample. Thus, the optical computing device, through use of the ICE and one or more detectors, is capable of extracting the information of one or multiple characteristics/analytes within a substance and converting that information into a detectable output signal reflecting the overall properties of a sample. Such characteristics may include, for example, the presence of certain elements, compositions, fluid phases, etc. existing within the substance.

During operation, downhole temperature fluctuations can have a detrimental effect on the accuracy of the optical computing device. As the temperature of the optical computing device changes, the operating characteristics of various components, such as the detectors, are gradually altered as well. As the detector continues to warm, eventually the output signal goes to zero. This phenomenon is referred to as "thermal drift." Since the accuracy of the optical computing device is in-part based upon the stability of the detectors, thermal drift naturally introduces errors into the output signals as well.

Conventional methods have failed to provide sufficient solutions to the thermal drift problem. The conventional solution has been to heat or cool the detectors, thereby reducing the thermal drift characteristics. However, this approach is disadvantageous because the power requirement for the circuitry necessary to actively heat and cool the computing devices is high. In addition, the space required to house the heating and cooling components result in a larger computing device.

DESCRIPTION OF ILLUSTRATIVE EMBODIMENTS

Figure 1:
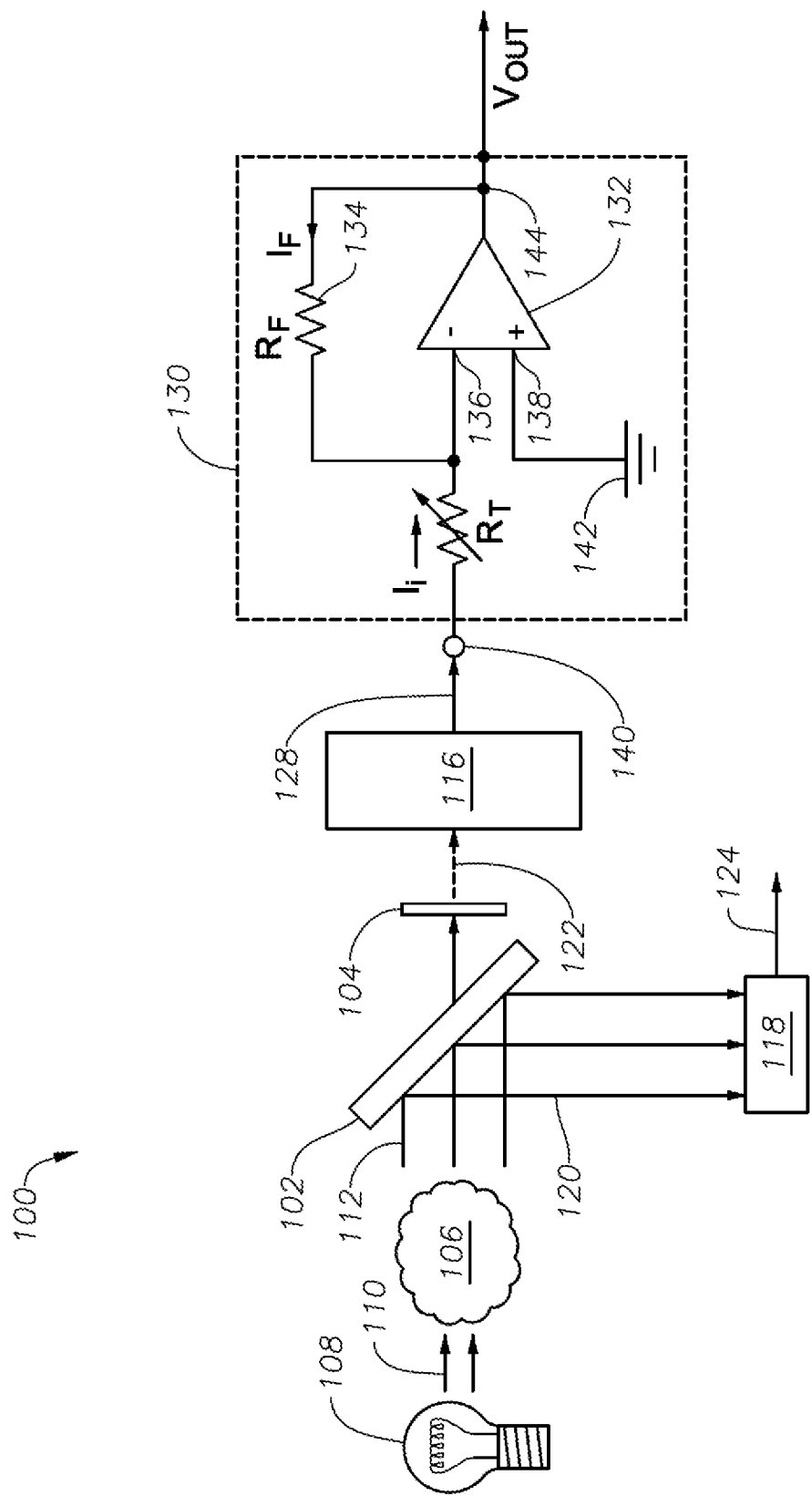
FIG. 1 is a block illustration of an optical computing device utilizing a thermal drift compensation circuit according to certain illustrative embodiments of the present disclosure.

Illustrative embodiments and related methods of the present disclosure are described below as they might be employed in a device and method to compensate for thermal drift. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, embodiments of the present disclosure are directed to methods to compensate for and/or minimize the effects of thermal drift on the output signals of detectors in optical computing devices. To address detector signal saturation or system performance degradation arising from temperature fluctuations in the optical detectors or detector/amplifier circuitry, certain illustrative embodiments described herein incorporate a negative temperature coefficient element into the gain of the detector. Such embodiments enable the gain of the detector to scale with the temperature, thus limiting the voltage change in the amplifier and increasing the thermal operational range of the detector and amplifier without approaching saturation or limited signal. These and other advantages of the present disclosure will be apparent to those ordinarily skilled in the art having the benefit of this disclosure.

As will be described in more detail below, each optical computing device described herein optically interacts with a sample of interest (wellbore fluid, for example) to determine a characteristic of the sample. In certain illustrative embodiments, the characteristics determined include the presence and quantity of specific inorganic gases such as, for example, $CO_2$ and $H_2S$, organic gases such as methane (C1), ethane (C2) and propane (C3), saline water, dissolved ions (Ba, Cl, Na, Fe, or Sr, for example), or various other characteristics (pH, density and specific gravity, viscosity, total dissolved solids, sand content, etc.). In certain embodiments, a single optical computing device may detect a single characteristic or multiple characteristics, as will be understood by those ordinarily skilled in the art having the benefit of this disclosure.

As used herein, the term "substance," "sample" or variations thereof, refers to at least a portion of matter or material of interest to be tested or otherwise evaluated with the help of the optical computing devices described herein. The substance may be any fluid capable of flowing, including particulate solids, liquids, gases (e.g., air, nitrogen, carbon dioxide, argon, helium, methane, ethane, butane, and other hydrocarbon gases, hydrogen sulfide, and combinations thereof), slurries, emulsions, powders (e.g., cements, concretes, etc.), drilling fluids (i.e., "muds"), glasses, mixtures, combinations thereof. The substance may include, but is not limited to, aqueous fluids (e.g., water, brines, etc.), non-aqueous fluids (e.g., organic compounds, hydrocarbons, oil, a refined component of oil, petrochemical products, and the like), acids, surfactants, biocides, bleaches, corrosion inhibitors, foamers and foaming agents, breakers, scavengers, stabilizers, clarifiers, detergents, treatment fluids, fracturing fluids, formation fluids, or any oilfield fluid, chemical, or substance commonly found in the oil and gas industry. The substance may also refer to solid materials such as, but not limited to, rock formations, concrete, solid wellbore surfaces, pipes or flow lines, and solid surfaces of any wellbore tool or projectile (e.g., balls, darts, plugs, etc.).

As used herein, the term "characteristic" or "characteristic of interest" refers to a chemical, mechanical, or physical property of a substance or a sample of the substance. The characteristic of the substance may include a quantitative or qualitative value of one or more chemical constituents or compounds present therein or any physical property associated therewith. Such chemical constituents and compounds may be referred to herein as "analytes." Illustrative characteristics of a substance that can be analyzed with the help of the optical processing elements described herein can include, for example, chemical composition (e.g., identity and concentration in total or of individual components), phase presence (e.g., gas, oil, water, etc.), impurity content, pH, alkalinity, viscosity, density, ionic strength, total dissolved solids, salt content (e.g., salinity), porosity, opacity, bacteria content, total hardness, transmittance, state of matter (solid, liquid, gas, emulsion, mixtures thereof, etc.), and the like.

As used herein, the term "electromagnetic radiation" refers to radio waves, microwave radiation, terahertz, infrared and near-infrared radiation, visible light, fluorescent light, ultraviolet light, X-ray radiation and gamma ray radiation.

As used herein, the phrase "optically interact" or variations thereof refers to the reflection, transmission, scattering, diffraction, or absorption of electromagnetic radiation either on, through, or from an optical processing element (e.g., an ICE) or a substance being analyzed with the optical computing device. Accordingly, optically interacted light refers to electromagnetic radiation that has been reflected, transmitted, scattered, diffracted, or absorbed by, emitted, or re-radiated, for example, using an optical processing element, but may also apply to optical interaction with a substance.

As used herein, the term "optical computing device" refers to an optical device that is configured to receive an input of electromagnetic radiation associated with a substance and produce an output of electromagnetic radiation from an optical processing element arranged within or otherwise associated with the optical computing device. The optical processing element may be, for example, an ICE.

The electromagnetic radiation that optically interacts with the optical processing element is changed so as to be readable by a detector, such that an output of the detector can be correlated to a particular characteristic of the substance being analyzed. The output of electromagnetic radiation from the optical processing element can be reflected, transmitted, and/or dispersed electromagnetic radiation. Whether the detector analyzes reflected, transmitted, or dispersed electromagnetic radiation may be dictated by the structural parameters of the optical computing device as well as other considerations known to those skilled in the art.

FIG. 1 illustrates an optical computing device 100 that compensates for thermal detector drift through utilization of amplification circuitry, according to one or more illustrative embodiments of the present disclosure. As shown in FIG. 1, an electromagnetic radiation source 108 may be configured to emit or otherwise generate electromagnetic radiation 110. As understood in the art, electromagnetic radiation source 108 may be any device capable of emitting or generating electromagnetic radiation. For example, electromagnetic radiation source 108 may be a light bulb, UV light, vacuum UV light, light emitting device, laser, blackbody emitted from sample 106, photonic crystal, or X-Ray source, etc. In one embodiment, electromagnetic radiation 110 may be configured to optically interact with the sample 106 and generate sample-interacted light 112 directed to a beam splitter 102. Sample 106 may be any fluid, solid substance or material such as, for example, rock formations, concrete, other solid surfaces, etc. While FIG. 1 shows electromagnetic radiation 110 passing through or incident upon sample 106 to produce sample-interacted light 112 (i.e., transmission mode or fluorescent mode), it is also contemplated herein to reflect electromagnetic radiation 110 off of sample 106 (i.e., reflectance mode), such as in the case of a sample 106 that is translucent, opaque, or solid, and equally generate the sample-interacted light 112.

Sample 106 may be provided to device 100 through a flow pipe or sample cell, for example, containing sample 106, whereby it is introduced to electromagnetic radiation 110. After being illuminated with electromagnetic radiation 110, sample 106 containing an analyte/characteristic of interest produces an output of electromagnetic radiation (sample-interacted light 112, for example). Although not specifically shown, one or more spectral elements may be employed in device 100 in order to restrict the optical wavelengths and/or bandwidths of the system and, thereby, eliminate unwanted electromagnetic radiation existing in wavelength regions that have no importance. As will be understood by those ordinarily skilled in the art having the benefit of this disclosure, such spectral elements can be located anywhere along the optical train, but are typically employed directly after the light source which provides the initial electromagnetic radiation. Various other configurations and applications of spectral elements that may be employed with the present disclosure, as will be understood by those ordinarily skilled in the art having the benefit of this disclosure.

Still referring to the illustrative embodiment of FIG. 1, beam splitter 102 is employed to split sample-interacted light 112 into a transmitted electromagnetic radiation 114 (A Channel or characteristic optical channel) having a given light intensity and a reflected electromagnetic radiation 120 (B Channel or normalization optical channel), also having a given light intensity. Transmitted electromagnetic radiation 114 is then directed to one or more optical elements 104. Optical element 104 may be a variety of optical elements such as, for example, one or more narrow band optical filters or ICEs (e.g., MOE) arranged or otherwise used in series in order to determine the characteristics of sample 106. In those embodiments using ICEs, the ICE may be configured to be associated with a particular characteristic of sample 106 or may be designed to approximate or mimic the regression vector of the characteristic in a desired manner, as would be understood by those ordinarily skilled in the art having the benefit of this disclosure. Additionally, in an alternative embodiment, optical element 104 may function as both a beam splitter and computational processor, as will be understood by those same ordinarily skilled persons.

Nevertheless, transmitted electromagnetic radiation 114 then optically interacts with optical element 104 to produce optically interacted light 122. In this embodiment, optically interacted light 122, which is related to the characteristic of interest, is conveyed to detector 116 for analysis and quantification. Detector 116 may be any device capable of detecting electromagnetic radiation, and may be generally characterized as an optical transducer. For example, detector 116 may be, but is not limited to, a thermal detector such as a thermopile, pneumatic, thermocouple, thermistor, bolometer or pyroelectric detector. Detector 116 may also be a photoacoustic detector, a semiconductor detector, a piezoelectric detector, charge coupled device ("CCD") detector, charge injection device ("CID") detector, video or array detector, split detector, photon detector (such as a photomultiplier tube or vacuum phototube), photodiodes, and/or combinations thereof, or the like, or other detectors known to those ordinarily skilled in the art. In those embodiments using photoconductors, materials used may include, for example, PbSe, CdS, CDse, GeAu, GeHg, GeCu, GeCd, Ge, Zn, InAs, InGaAs, InSb, He—Cd—Te or Pb—Sn—Te. In those embodiments using photovoltaic detectors, materials used may include, for example, Si, CdTe and copper indium gallium (di)selinide ("CIGS").

Each element in detector 116 is further configured to produce an output signal 128 in the form of a voltage that corresponds to the particular characteristic of the sample 106. In at least one embodiment, output signal 128 produced by detector 116 and the concentration of the characteristic of the sample 106 may be directly proportional. In other embodiments, the relationship may be a polynomial function, an exponential function, and/or a logarithmic function.

Optical computing device 100 also includes a second detector 118 arranged to receive and detect reflected electromagnetic radiation of the normalization optical channel and output a compensating signal 124. As understood in the art, reflected electromagnetic radiation 120 may include a variety of radiating deviations stemming from electromagnetic radiation source 108 such as, for example, intensity fluctuations in the electromagnetic radiation, interferent fluctuations (for example, dust or other interferents passing in front of the electromagnetic radiation source), combinations thereof, or the like. Thus, second detector 118 detects such radiating deviations as well. In an alternative embodiment, second detector 118 may be arranged to receive a portion of the sample-interacted light 112 instead of reflected electromagnetic radiation 120, and thereby compensate for electromagnetic radiating deviations stemming from the electromagnetic radiation source 108. In yet other embodiments, second detector 118 may be arranged to receive a portion of electromagnetic radiation 110 instead of reflected electromagnetic radiation 120, and thereby likewise compensate for electromagnetic radiating deviations stemming from the electromagnetic radiation source 108. Moreover, a single detector may be utilized in place of detectors 116, 118, or an array of detectors may be utilized. Those ordinarily skilled in the art having the benefit of this disclosure will realize there are a variety of design alterations which may be utilized in conjunction with the present disclosure.

Still referring to FIG. 1, to address detector signal saturation or degradation arising from temperature fluctuations to detectors 116, 118 and/or detector/amplifier circuitry, a thermal drift compensation circuit 130 (i.e., amplification circuitry) is connected to receive the output signal of detector 116. However, alternative embodiments may also utilize thermal drift compensation circuit 130 on detector 118 or any other desired detector, as would be understood by those ordinarily skilled having the benefit of this disclosure. Thermal drift compensation circuit 130 comprises an operational amplifier 132, or "op-amp," having an inverting input 136 and a non-inverting input 138. A series input resistor $R_T$ has a first end connected to inverting input 136 and a second end connected to input signal 140, which corresponds to output signal 128. Non-inverting input 138 of operational amplifier 132 is connected to ground 142.

Series input resistor $R_T$ is a negative temperature coefficient resistor. As described herein, negative temperature coefficient resistor $R_T$ is a resistor which self-adjusts its resistance in inverse proportionality to the temperature of optical computing device 300 (for example, the temperature of thermal drift compensation circuit 130). Negative temperature coefficient resistor may be, for example, a thermistor, as will be understood by those ordinarily skilled in the art having the benefit of this disclosure. Feedback resistor 134, or $R_F$, has a first end connected to an output 144 of operational amplifier 132. The second end of feedback resistor $R_F$ is connected to inverting input 136 of operational amplifier 132, thus providing $I_F$ to inverting input 136.

In operation, detector 116 produces output signal 128 (i.e., input signal 140, having a value on the order of microvolts which, in turn, will be amplified by thermal drift compensation circuit 130. In this illustrative embodiment, thermal drift compensation circuit 130 has a positive gain when the temperature of thermal drift compensation circuit 130 increases. Thus, as the temperature increases, the value, or resistance, of $R_T$ goes down and more current passes therethrough, which maintains a sufficient output voltage signal $V_{OUT}$ at output 144. As the temperature decreases, the value of $R_T$ goes up, thus allowing less current $I_i$ to pass thereto. As a result, less current is provided to inverting input 136, which in turn maintains a stable output signal. Thus, op-amp 132 operates as intended to amplify the signal at output 144 when necessary. The signal at output 144 may be referred to as a "scaled output signal."

Accordingly, thermal drift compensation circuit 130 enables its gain (and, thus, the gain of detector 116) to scale with temperature, thus limiting the voltage change in op-amp 132 and increasing the thermal operational range of detector 116 and op-amp 132 without approaching a saturation or limited signal state. As a result, optical computing device 100 is adapted to compensate for the effects of thermal detector drift.

Although not shown in FIG. 1, in certain illustrative embodiments, output signal $V_{OUT}$ and second detector 118 may be communicably coupled to a signal processor (not shown) such that output signal 144 and compensating signal 124 indicative of electromagnetic radiating deviations may be provided or otherwise conveyed thereto. The signal processor may then be configured to computationally combine compensating signal 124 with output signal 144 to provide a more accurate determination of the characteristic of sample 106, while compensating for any thermal drift effects on detector 116. However, in other embodiments that utilized only one detector, the signal processor would be coupled to the one detector. Nevertheless, in the embodiment of FIG. 1, for example, the signal processor computationally combines compensating signal 124 with output signal 144 (output A/B signal ratio, as understood in art) via multivariate statistical analysis techniques such as, for example, standard partial least squares which are available in most statistical analysis software packages (for example, XL Stat for MICROSOFT® EXCEL®; the UNSCRAMBLER® from CAMO Software and MATLAB® from MATHWORKS®), as will be understood by those ordinarily skilled in the art having the benefit of this disclosure.

Figure 2:
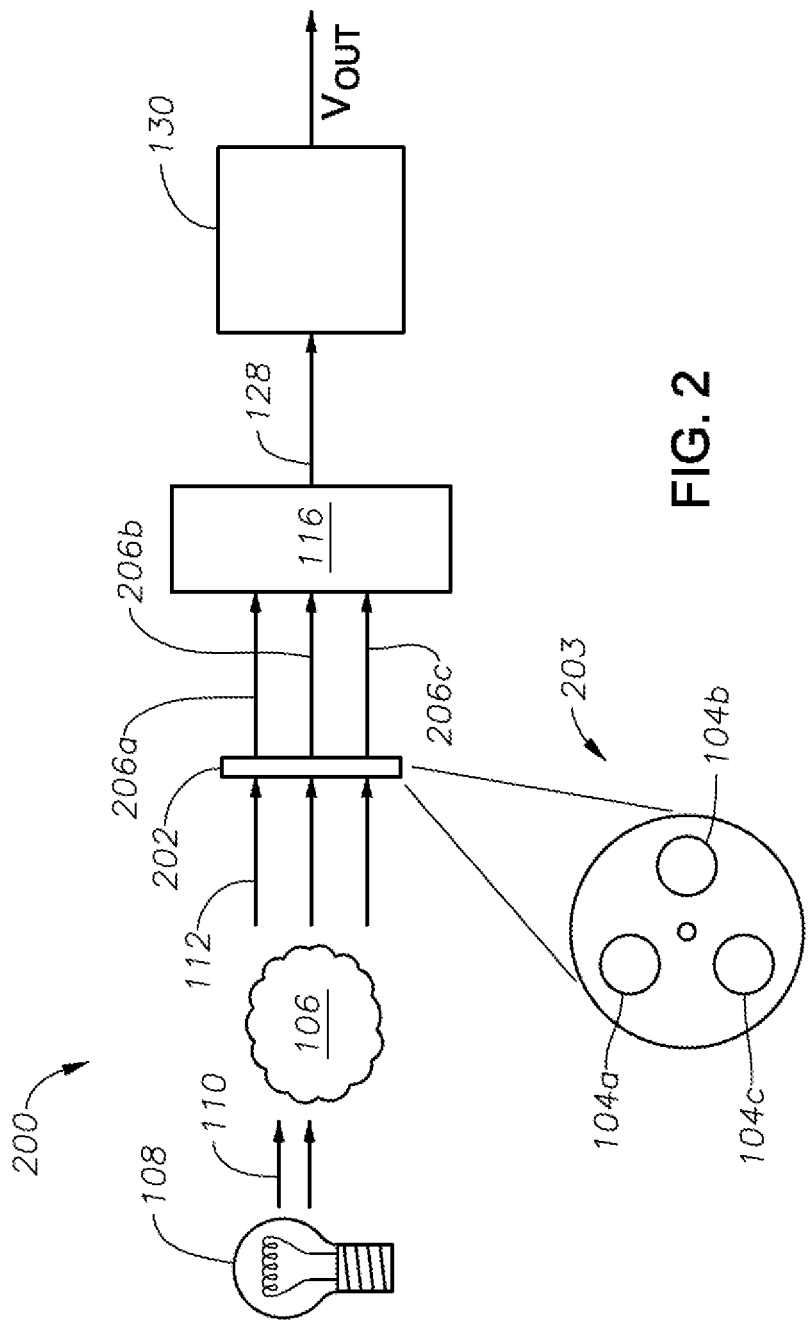
FIG. 2 is a block illustration of an optical computing device utilizing a thermal drift compensation circuit according to an alternative illustrative embodiment of the present disclosure.

FIG. 2 illustrates yet another optical computing device 200, in the time domain, which compensates for thermal detector drift through utilization of amplification circuitry, according to certain illustrative embodiments of the present disclosure. Optical computing device 200 is somewhat similar to optical computing device 100 described with reference to FIG. 1 and, therefore, may be best understood with reference thereto, where like numerals indicate like elements. The device 200 may include a movable assembly 202 having one or more optical elements 104a,b,c associated therewith. As illustrated, the movable assembly 202 may be characterized at least in one embodiment as a rotating disc 203, such as, for example, a filter wheel, wherein optical elements 104a,b,c are radially disposed for rotation therewith. FIG. 2 also illustrates corresponding frontal views of the moveable assembly 202, which is described in more detail below.

Those ordinarily skilled in the art having the benefit of this disclosure will readily recognize, however, that movable assembly 202 may be characterized as any type of movable assembly configured to sequentially align at least one detector with optically interacted light and/or one or more optical elements. Each optical element 104a,b,c may be similar in construction to those as previously described herein, and configured to be either associated or disassociated with a particular characteristic of the sample 106.

In certain illustrative embodiments, rotating disc 203 may be rotated at a frequency of about 0.1 RPM to about 30,000 RPM. In operation, rotating disc 203 may rotate such that each individual optical element 104a,b,c may be exposed to or otherwise optically interact with the sample-interacted light 112 for a distinct brief period of time. Upon optically interacting with the sample-interacted light 112, optical element 104a is configured to generate a characteristic optical channel that includes optically interacted light 206a having a given light intensity. In addition, second optical elements 104b,c are configured to generate a second and third optically-interacted light 206b,c, respectively. Alternatively, one of the second or third optically-interacted lights may be a normalization optical channel.

Nevertheless, detector 116 then receives each optically-interacted light 206a-c and thereby generates a first, second and third output signal (i.e., output signal 128) of the characteristic and/or normalization optical channel. As previously described, thermal drift compensation circuit 130 is coupled to output signal 128 to thereby enable the gain of detector 128 to scale with temperature, thus increasing the thermal operational range of detector 116 without approaching a saturation or limited signal state. As a result, optical computing device 200 is adapted to compensate for the effects of thermal detector drift. Although not shown, a signal processor is communicatively coupled to thermal drift compensation circuit 130 to receive output signal $V_{OUT}$ to thereby computationally determine the sample characteristics.

Moreover, in certain illustrative embodiments of FIG. 2, detector 116 may be configured to time multiplex optically-interacted lights 206a-c between the individually-detected beams. For example, optical element 104a may be configured to direct optically-interacted light 206a toward the detector 116 at a first time T1, optical element 104b may be configured to direct optically-interacted light 206b toward the detector 116 at a second time T2, and optical element 204c may be configured to direct optically-interacted light 206c toward detector 116 at a third time T3. Consequently, detector 116 receives at least three distinct beams of optically-interacted light which, in turn, are output as three distinct output signals 128 in the form of a voltage that corresponds to the characteristic of the sample, as previously described. Output signals 128 are provided to thermal drift compensation circuit 130, which then scales the gain according to the temperature of optical computing device 200. Ultimately, output signal $V_{OUT}$ is provided to a signal processor (not shown) that computationally determines the characteristic(s) of sample 106. In certain alternate embodiments, optically-interacted lights 206a-c may be averaged over an appropriate time domain (for example, about 1 millisecond to about 1 hour) to more accurately determine the characteristic of sample 106.

Those ordinarily skilled in the art having the benefit of this disclosure will realize the aforementioned optical computing devices are illustrative in nature, and that there are a variety of other optical configurations which may be utilized. These optical configurations not only include the reflection, absorption or transmission methods described herein, but can also involve scattering (Raleigh & Raman, for example) as well as emission (fluorescence, X-ray excitation, luminescence, etc., for example) or attenuated total reflection. In addition, the optical computing device may comprise a parallel processing configuration whereby the sample-interacted light is split into multiple beams. The multiple beams may then simultaneously go through corresponding ICEs, whereby multiple characteristics of interest are simultaneously detected. In other embodiments, the ICE may utilize two substantially different light sources (UV and IR, for example) to cover the optical activity of all the characteristics of interest (i.e., some analytes might be only UV active, while others are IR active). Those ordinarily skilled in the art having the benefit of this disclosure will realize the choice of a specific optical configuration is mainly dependent upon the specific application and analytes of interest.

Figure 3A:
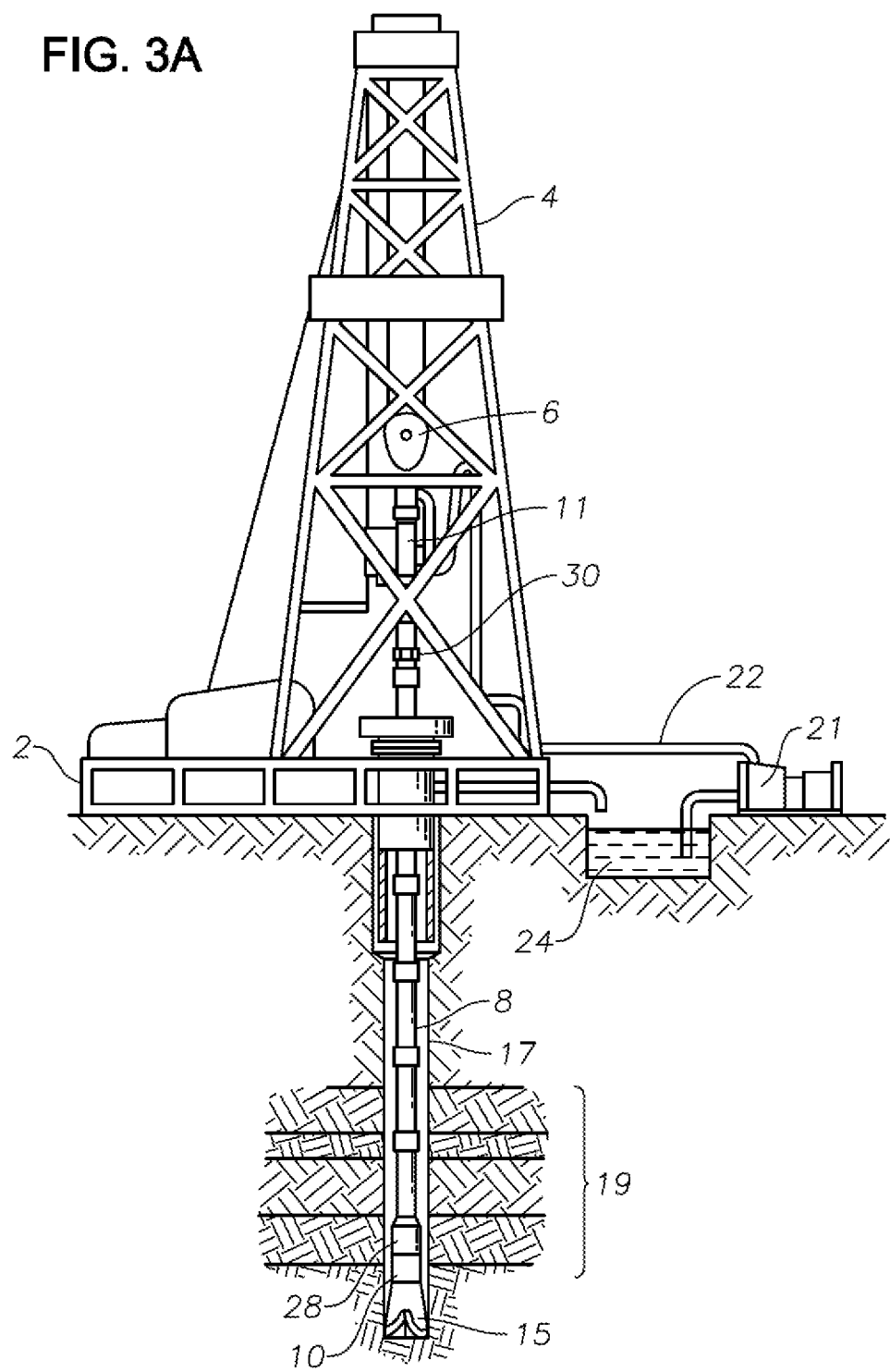
FIGS. 3A-B illustrate optical computing devices utilized in a downhole drilling and wireline application, respectively, according to illustrative methods of the present disclosure.
Figure 3B:
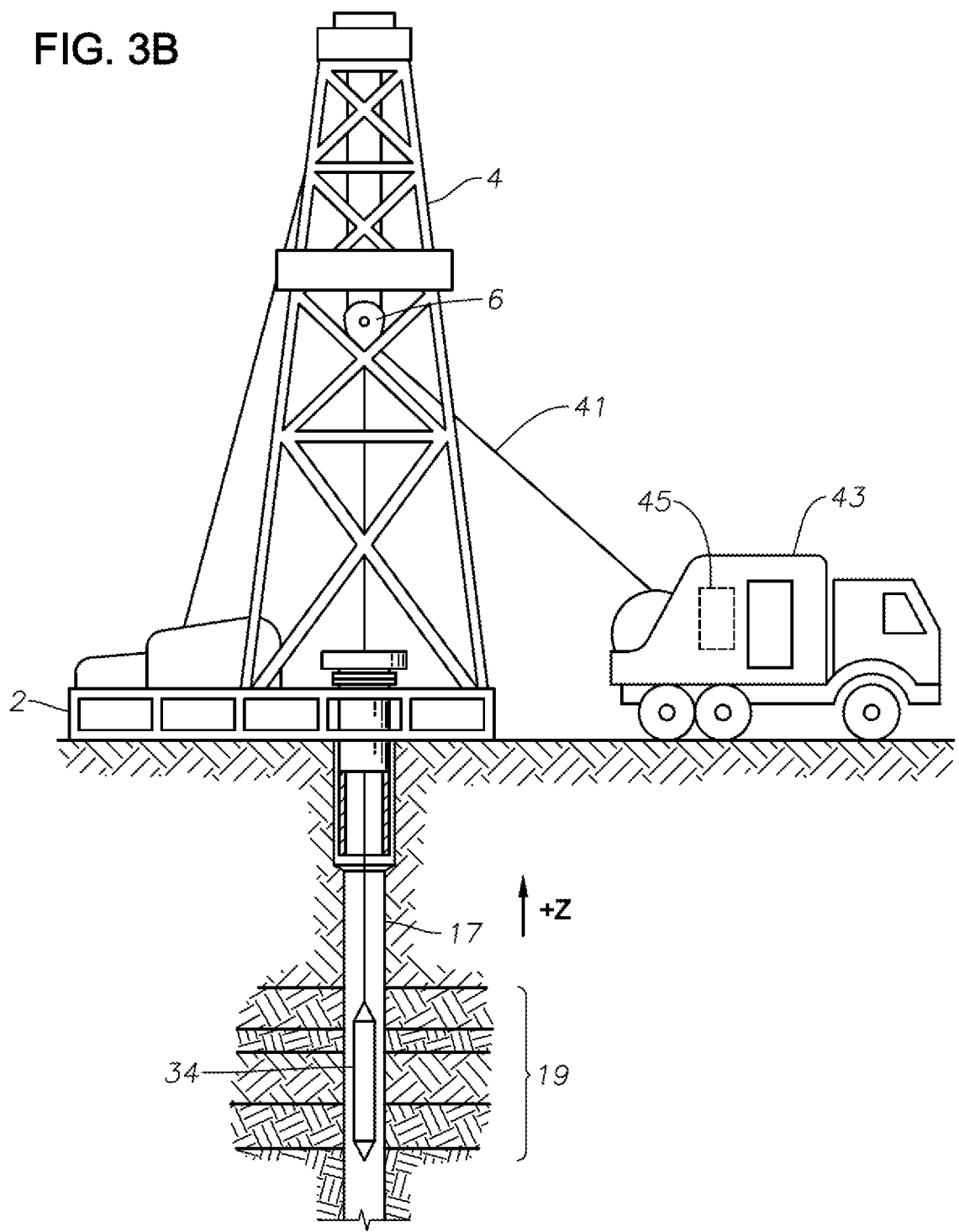

FIGS. 3A-B illustrate optical computing devices utilized in a downhole drilling and wireline application, respectively, according to illustrative methods of the present disclosure. FIG. 3A illustrates a drilling platform 2 equipped with a derrick 4 that supports a hoist 6 for raising and lowering a drill string 8 through various formations 19. Hoist 6 suspends a top drive 11 suitable for rotating drill string 8 and lowering it through well head 13. Connected to the lower end of drill string 8 is a drill bit 15. As drill bit 15 rotates, it creates a wellbore 17 that passes through various formations 19. A pump 21 circulates drilling fluid through a supply pipe 22 to top drive 11, down through the interior of drill string 8, through orifices in drill bit 15, back to the surface via the annulus around drill string 8, and into a retention pit 24. The drilling fluid transports cuttings from the borehole into pit 24 and aids in maintaining the integrity of wellbore 17. Various materials can be used for drilling fluid, including, but not limited to, a salt-water based conductive mud.

An acoustic logging tool 10 is integrated into the bottom-hole assembly near the bit 15. In this illustrative embodiment, logging tool 10 is an LWD tool equipped with an optical computing device (not shown) as described herein; however, in other illustrative embodiments, logging tool 10 may be utilized in a wireline or tubing-convey logging application. Moreover, in certain illustrative embodiments, logging tool 10 may be adapted to perform logging operations in both open and cased hole environments.

Still referring to FIG. 22A, as drill bit 15 extends wellbore 17 through formations 19, logging tool 10 collects acoustic measurement signals relating to various formation properties, as well as the tool orientation and various other drilling conditions. In addition, using the optical computing device, logging tool 10 may analyze samples flowing along wellbore 17 as described herein. In certain embodiments, logging tool 10 may take the form of a drill collar, i.e., a thick-walled tubular that provides weight and rigidity to aid the drilling process. A telemetry sub 28 may be included to transfer images and measurement data/signals to a surface receiver 30 and to receive commands from the surface. In some embodiments, telemetry sub 28 does not communicate with the surface, but rather stores logging data for later retrieval at the surface when the logging assembly is recovered.

FIG. 3B illustrates an alternative embodiment of the present disclosure whereby an optical computing device is utilized in a wireline application. At various times during the drilling process, drill string 8 may be removed from the borehole as shown in FIG. 3B. Once drill string 8 has been removed, logging operations can be conducted using a wireline logging sonde 34, i.e., a probe suspended by a cable 41 having conductors for transporting power to the sonde 34 and telemetry from sonde 34 to the surface. The wireline logging sonde 34 includes an optical computing device as described herein to analyze downhole samples. A logging facility 43 collects measurements from the logging sonde 34, and includes a computer system 45 for processing and storing the measurements gathered by the optical computing device and the transmitter/receivers.

In addition to downhole well or completion applications, embodiments of the present disclosure may also be utilized in a variety of other environments. Other environments may include those as diverse as those associated with surface and undersea monitoring, satellite or drone surveillance, pipeline monitoring, or even sensors transiting a body cavity such as a digestive tract. Within these environments, the optical computing devices may be utilized to evaluate formations, in addition to detecting various compounds or characteristics in order to monitor, in real time, various phenomena occurring within the environment.

Accordingly, the present disclosure provides devices and methods to minimize and/or alleviate the effects of thermal detector drift in optical computing devices, thus providing a more power reliable, efficient and robust computing device for use in surface and/or downhole applications. As a result, the stability, sensitivity and accuracy of optical computing devices utilizing the embodiments described herein are greatly improved as compared to conventional systems.

The illustrative embodiments described herein provide a number of advantages. First, for example, embodiments of the present disclosure drastically reduce the power requirement as compared to prior art systems because it is not necessary to actively heat or cool the detectors. Second, embodiments of the present disclosure expand the operating range of the computing device through utilization of the thermal drift compensation circuit described herein. Third, since negative temperature coefficient resistor 134 is self-adjusting, thermal compensation is achieved passively and requires no human intervention. Fourth, two or more detectors may be utilized with the present disclosure since the effect of the thermal drift experienced by such systems may also be minimized as described herein. Therefore, the foregoing advantages make the optical computing devices, and their variations described herein, particularly well-suited for field and downhole use.

Embodiments described herein further relate to any one or more of the following paragraphs:

1. An optical computing device, comprising electromagnetic radiation that optically interacts with a sample to produce sample-interacted light; an optical element positioned to optically interact with the sample-interacted light to generate optically interacted light that corresponds to a characteristic of the sample; a detector positioned to receive the optically interacted light thereby generate an output signal that is utilized to determine the characteristic of the sample; and amplification circuitry positioned to receive the output signal and thereby compensate for thermal drift of the detector.

2. An optical computing device as defined in paragraph 1, further comprising an electromagnetic radiation source that produces the electromagnetic radiation, the electromagnetic radiation optically interacting with the sample by at least one of a transmission, fluorescence, luminescence, emission, Raman or attenuated total reflection spectroscopic technique.

3. An optical computing device as defined in paragraph 1 or 2, wherein the amplification circuitry comprises an operational amplifier comprising an inverting input and a non-inverting input; a negative temperature coefficient resistor comprising a first end connected to the inverting input and a second end connected to an input signal corresponding to the output signal of the detector; and a feedback resistor comprising a first end connected to an output of the operational amplifier and a second end connected to the inverting input of the operational amplifier.

4. An optical computing device as defined in any of paragraphs 1-3, wherein the amplification circuitry comprises a thermistor having a resistance that adjusts in inverse proportionality to a temperature of the optical computing device.

5. An optical computing device as defined in any of paragraphs 1-4, wherein the amplification circuitry is adapted to enable a gain of the amplification circuitry to scale with temperature of the optical computing device.

6. An optical computing device as defined in any of paragraphs 1-5, wherein the detector a pneumatic, thermocouple, thermopile, thermistor, bolometer or pyroelectric thermal detector.

7. An optical computing device as defined in any of paragraphs 1-6, wherein the detector is a vacuum phototube or photomultiplier tube detector.

8. An optical computing device as defined in any of paragraphs 1-7, wherein the detector is a PbSe, CdS, CDse, GeAu, GeHg, GeCu, GeCd, Ge, Zn, InAs, InGaAs, InSb, He—Cd—Te or Pb—Sn—Te photoconductor.

9. An optical computing device as defined in any of paragraphs 1-8, wherein the detector is a Si, CdTe and copper indium gallium (di)selinide (CIGS) photovoltaic detector.

10. An optical computing device as defined in any of paragraphs 1-9, wherein the detector is a CCD or CIDs solid state detector.

11. An optical computing method to determine a characteristic of a sample, the method comprising optically interacting electromagnetic radiation with a sample to produce sample-interacted light; optically interacting an optical element with the sample-interacted light to generate optically interacted light that corresponds to the characteristic of the sample; generating an output signal corresponding to the optically interacted light through utilization of a detector; compensating for thermal drift of the detector using an amplification circuit; and determining the characteristic of the sample.

12. An optical computing method as defined in paragraph 11, further comprising providing the amplification circuit with an operational amplifier comprising an inverting input and a non-inverting input; providing a negative temperature coefficient resistor in the amplification circuit, the negative temperature coefficient resistor comprising a first end connected to the inverting input and a second end connected to an input signal corresponding to the output signal of the detector; and providing a feedback resistor in the amplification circuit, the feedback resistor comprising a first end connected to an output of the operational amplifier and a second end connected to the inverting input of the operational amplifier.

13. An optical computing method as defined in paragraphs 11 or 12, wherein compensating for the thermal drift of the detector further comprises adjusting a resistance of a negative temperature coefficient resistor inversely proportionally to a temperature of the amplification circuit.

14. An optical computing method as defined in any of paragraphs 11-13, wherein compensating for the thermal drift of the detector further comprises scaling a gain of the amplification circuit based upon a temperature of the amplification circuit.

15. An optical computing method to determine a characteristic of a sample, the method comprising optically interacting electromagnetic radiation with a sample to produce sample-interacted light; optically interacting an optical element with the sample-interacted light to generate optically interacted light that corresponds to the characteristic of the sample; generating an output signal corresponding to the optically interacted light through utilization of a detector; scaling a gain of the detector as a function of temperature to thereby generate a scaled output signal; and determining the characteristic of the sample using the scaled output signal.

16. An optical computing method as defined in paragraph 15, wherein scaling the gain is achieved utilizing an amplification circuit.

17. An optical computing method as defined in paragraphs 15 or 16, wherein scaling the gain comprises adjusting a resistance of a negative temperature coefficient resistor based upon the temperature.

Although various embodiments and methods have been shown and described, the disclosure is not limited to such embodiments and methods, and will be understood to include all modifications and variations as would be apparent to one ordinarily skilled in the art. Therefore, it should be understood that the embodiments are not intended to be limited to the particular forms disclosed. Rather, the intention is to cover all modifications, equivalents and alternatives falling within the spirit and scope of the disclosure as defined by the appended claims.

What is claimed is:

1. An optical computing device, comprising:
   electromagnetic radiation that optically interacts with a sample to produce sample-interacted light;
   an optical element positioned to optically interact with the sample-interacted light to generate optically interacted light that corresponds to a characteristic of the sample, the optical element being a multivariate optical element that approximates or mimics a regression vector of the characteristic of the sample;
   a detector positioned to receive the optically interacted light thereby generate an output signal that is utilized to determine the characteristic of the sample; and
   amplification circuitry positioned to receive the output signal and thereby compensate for thermal drift of the detector, the amplification circuitry having a negative temperature coefficient resistor which self-adjusts its resistance in inverse proportionality to a temperature of the optical computing device.

2. An optical computing device as defined in claim 1, further comprising an electromagnetic radiation source that produces the electromagnetic radiation, the electromagnetic radiation optically interacting with the sample by at least one of a transmission, fluorescence, luminescence, emission, Raman or attenuated total reflection spectroscopic technique.

3. An optical computing device as defined in claim 1, wherein the amplification circuitry comprises:
   an operational amplifier comprising an inverting input and a non-inverting input;
   the negative temperature coefficient resistor comprising a first end connected to the inverting input and a second end connected to an input signal corresponding to the output signal of the detector; and
   a feedback resistor comprising a first end connected to an output of the operational amplifier and a second end connected to the inverting input of the operational amplifier.

4. An optical computing device as defined in claim 1, wherein the negative temperature coefficient resistor is a thermistor.

5. An optical computing device as defined in claim 1, wherein the amplification circuitry is adapted to enable a gain of the amplification circuitry to scale with a temperature of the optical computing device.

6. An optical computing device as defined in claim 1, wherein the detector is a pneumatic, thermocouple, thermopile, thermistor, bolometer or pyroelectric thermal detector.

7. An optical computing device as defined in claim 1, wherein the detector is a vacuum phototube or photomultiplier tube detector.

8. An optical computing device as defined in claim 1, wherein the detector is a PbSe, CdS, CDse, GeAu, GeHg, GeCu, GeCd, Ge, Zn, InAs, InGaAs, InSb, He—Cd—Te or Pb—Sn—Te photoconductor.

9. An optical computing device as defined in claim 1, wherein the detector is a Si, CdTe and copper indium gallium (di)selinide (CIGS) photovoltaic detector.

10. An optical computing device as defined in claim 1, wherein the detector is a CCD or CIDs solid state detector.

11. An optical computing method to determine a characteristic of a sample, the method comprising:
   optically interacting electromagnetic radiation with a sample to produce sample-interacted light;
   optically interacting an optical element with the sample-interacted light to generate optically interacted light that corresponds to the characteristic of the sample, the optical element being a multivariate optical element that approximates or mimics a regression vector of the characteristic of the sample;
   generating an output signal corresponding to the optically interacted light through utilization of a detector;
   compensating for thermal drift of the detector using an amplification circuit having a negative temperature coefficient resistor which self-adjusts its resistance in inverse proportionality to a temperature of the detector; and determining the characteristic of the sample.

12. An optical computing method as defined in claim 11, further comprising:

providing the amplification circuit with an operational amplifier comprising an inverting input and a non-inverting input;

providing the negative temperature coefficient resistor with a first end connected to the inverting input and a second end connected to an input signal corresponding to the output signal of the detector; and providing a feedback resistor in the amplification circuit, the feedback resistor comprising a first end connected to an output of the operational amplifier and a second end connected to the inverting input of the operational amplifier.

13. An optical computing method as defined in claim 11, wherein compensating for the thermal drift of the detector further comprises scaling a gain of the amplification circuit based upon a temperature of the amplification circuit.

14. An optical computing method to determine a characteristic of a sample, the method comprising:

optically interacting electromagnetic radiation with a sample to produce sample-interacted light;

optically interacting an optical element with the sample-interacted light to generate optically interacted light that corresponds to the characteristic of the sample, the optical element being a multivariate optical element that approximates or mimics a regression vector of the characteristic of the sample;

generating an output signal corresponding to the optically interacted light through utilization of a detector;

scaling a gain of the detector as a function of temperature to thereby generate a scaled output signal, the scaling being achieved using a negative temperature coefficient resistor which self-adjusts its resistance in inverse proportionality to the temperature; and determining the characteristic of the sample using the scaled output signal.

15. An optical computing method as defined in claim 14, wherein scaling the gain is achieved utilizing an amplification circuit comprising:

an operational amplifier having an inverting input and a non-inverting input, wherein the negative temperature coefficient resistor comprises a first end connected to the inverting input and a second end connected to an input signal corresponding to the output signal of the detector; and a feedback resistor comprising a first end connected to an output of the operational amplifier and a second end connected to the inverting input of the operational amplifier.

* * * * *